(12) United States Patent
Feng

(10) Patent No.: US 11,158,680 B2
(45) Date of Patent: Oct. 26, 2021

(54) DISPLAY PANEL INCLUDING PLURALITY OF PIXEL APERTURES AND DISPLAY DEVICE

(71) Applicant: BOE Technology Group Co., Ltd., Beijing (CN)

(72) Inventor: Yu Feng, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 15/930,618

(22) Filed: May 13, 2020

(65) Prior Publication Data

US 2021/0143229 A1    May 13, 2021

(30) Foreign Application Priority Data

Nov. 8, 2019  (CN) .......................... 201911084995.3

(51) Int. Cl.
*H01L 27/32*          (2006.01)
(52) U.S. Cl.
CPC ...... *H01L 27/3218* (2013.01); *H01L 27/3246* (2013.01)

(58) Field of Classification Search
CPC .. H01L 27/3218; H01L 27/3246; H01L 27/32
USPC ........................................ 257/40; 438/82, 99
See application file for complete search history.

(56) References Cited

U.S. PATENT DOCUMENTS

| 2016/0358985 | A1* | 12/2016 | Bai ...................... G09G 3/3208 |
| 2018/0175121 | A1* | 6/2018 | Ji .............................. H01L 51/52 |
| 2018/0321782 | A1* | 11/2018 | Qin ........................ G06F 3/047 |
| 2019/0011830 | A1* | 1/2019 | Ji ........................ H01L 27/3216 |

* cited by examiner

*Primary Examiner* — Didarul A Mazumder
(74) *Attorney, Agent, or Firm* — Arent Fox LLP; Michael Fainberg

(57) ABSTRACT

The present disclosure relates to a display panel and a display device. The display panel includes a transparent display area, and a non-transparent display area. The transparent display area has a plurality of first pixel apertures, and the non-transparent display area has a plurality second pixel apertures. A density of the first pixel apertures of the transparent display area is smaller than a density of the second pixel apertures of the non-transparent display area, and opposite sides of each the first pixel aperture are provided with first spacers.

20 Claims, 6 Drawing Sheets

--Related Art-- and display device.
DISPLAY PANEL INCLUDING PLURALITY OF PIXEL APERTURES AND DISPLAY DEVICE The present application claims the priority of the Chinese patent application No. 201911084995.3, filed with the Chinese Patent Office on Nov. 8, 2019, the content of which is incorporated by reference herein its entirety.

FIELD

The present disclosure relates to the technical field of semiconductors, and particularly to a display panel and a display device.

BACKGROUND

A Flat Panel Display (FPD) has become a mainstream product on the market, and there is an increasing number of types of FPDs, such as Liquid Crystal Displays (LCDs), Organic Light Emitting Diode (OLED) displays, Plasma Display Panels (PDP) and Field Emission Displays (FEDs) and the like.

For a partially transparent display panel, generally a display area (AA area) is divided into two areas: a non-transparent area (H) and a transparent display area (L). The area H is normally displayed and the area L is transparently displayed, which can increase remarkably a screen occupying ratio.

SUMMARY

An embodiment of the present disclosure provides a display panel and a display device. The display panel includes a transparent display area and a non-transparent display area. The transparent display area has a plurality of first pixel apertures and the non-transparent area has a plurality of second pixel apertures. A density of the first pixel apertures of the transparent display area is smaller than a density of the second pixel apertures of the non-transparent display area, and opposite sides of each the first pixel aperture are provided with first spacers.

In a possible implementation mode, each the first pixel aperture comprises a first color pixel aperture, a second color pixel aperture, a third color pixel aperture and a first transparent area.

The first color pixel apertures and the second color pixel apertures are alternately arranged in sequence along a first direction to form first-type pixel rows, the third color pixel apertures and the first transparent areas are alternately arranged in sequence along a direction parallel to the first direction to form second-type pixel rows, and the first-type pixel rows and the second-type pixel rows are alternately arranged along a direction perpendicular to the first direction.

In each the first-type pixel row, each the first spacer is positioned between adjacent the first color pixel aperture and the second color pixel aperture; and in each the second-type pixel row, each the first spacer is positioned between adjacent the third color pixel aperture and the first transparent area.

In a possible implementation mode, the first spacers in each the first-type pixel row and the first spacers in each the second-type pixel row are in staggered arrangement.

In a possible implementation mode, each group of adjacent first color pixel aperture, second color pixel aperture, third color pixel aperture, and first transparent area, among the first color pixel apertures, the second color pixel apertures, the third color pixel apertures, and the first transparent areas, constitutes a first pixel.

Second transparent areas are formed between every two adjacent first pixels along a direction parallel to the first direction, where width of each the second transparent area in the first direction and width of each the first pixel in the first direction are a same width; and third transparent areas are formed between every two adjacent first pixels along a direction perpendicular to the first direction, where width of each the third transparent area in the direction perpendicular to the first direction and width of each the first pixel in the direction perpendicular to the first direction is a same width.

In a possible implementation mode, a shape of each the first color pixel aperture, a shape of each the second color pixel aperture and a shape of each the third color pixel aperture are similar.

In a possible implementation mode, each the first color pixel aperture, each the second color pixel aperture and each the third color pixel aperture are hexagonal.

In a possible implementation mode, a line connecting vertexes of two opposite corners of each first color pixel aperture is perpendicular to the first direction, a line connecting vertexes of two opposite corners of each second color pixel aperture is perpendicular to the first direction, and a line connecting vertexes of two opposite corners of each third color pixel aperture is perpendicular to the first direction.

In a possible implementation mode, the first color pixel apertures are blue pixel apertures, the second color pixel apertures are red pixel apertures and the third color pixel apertures are green pixel apertures.

In a possible implementation mode, area of each the blue pixel aperture is larger than area of each the green pixel aperture, and area of each the green pixel aperture is larger than area of each the red pixel aperture.

In a possible implementation mode, each the second pixel aperture comprises a fourth color pixel aperture, a fifth color pixel aperture and a sixth color pixel aperture.

The fourth color pixel apertures, the fifth color pixel apertures and the sixth color pixel apertures are alternately arranged in sequence along a direction parallel to the first direction to form third-type pixel rows.

In a possible implementation mode, a second spacer is arranged at an interval of plural ones of the color pixel apertures in each the third-type pixel row.

In a possible implementation mode, in each two adjacent third-type pixel rows, the second spacers in one of the two adjacent third-type pixel rows, and the second spacers in other one of the two adjacent third-type pixel rows, are in staggered arrangement in sequence.

In a possible implementation mode, gap areas are formed between the first spacers and the first color pixel apertures, the first spacers and the second color pixel apertures, the first spacers and the third color pixel apertures, and, the first spacers and the first transparent area.

In a possible implementation mode, the display panel further comprises a pixel defining layer, where the first pixel apertures and the second pixel apertures are apertures of the pixel defining layer.

An embodiment of the present disclosure further provides a display device comprising the display panel provided by the embodiments of the present disclosure.

DETAILED DESCRIPTION OF THE EMBODIMENTS

In order to make objectives, technical solutions and advantages of the present disclosure clearer, the technical solutions of the present disclosure will be described clearly and comprehensively in combination with accompanying drawings. It is apparent that the described embodiments are merely part of embodiments of the present disclosure rather than all embodiments. Based on the described embodiments of the present disclosure, all other embodiments obtained by those skilled in the art without paying creative labor shall fall into the protection scope of the present disclosure.

Unless defined otherwise, the technical terms or scientific terms used in the present disclosure should have common meanings understood by ordinary those skilled in the field to which the present disclosure pertains. The terms "first", "second" and the like used in the present disclosure merely serve to distinguish different components rather than indicating any sequence, number or importance. The terms "comprising" or "including" and the like indicate that elements or items preceding the terms cover elements or items following the terms and equivalents thereof. The term "connecting" or "linking" and the like may cover a direct or indirect electrical connection, not limited to a physical or mechanical connection. The terms "upper", "lower", "left", "right" and the like merely indicate relative positional relationships, and when an absolute position of a described object changes, the relative positional relationships may also change accordingly.

In order to maintain clarity and conciseness of the following description of the embodiments of the present disclosure, the present disclosure omits detailed description of known functions and parts.

Spacers in the area L (i.e. transparent display area) of a display panel in related art, provide a relatively weak support for a mask, which easily causes damage to a film layer during a manufacturing process of the display panel, and besides, a problem of non-uniformity of visual color errors also exists in the area L when viewed from different angles.

Figure 1:
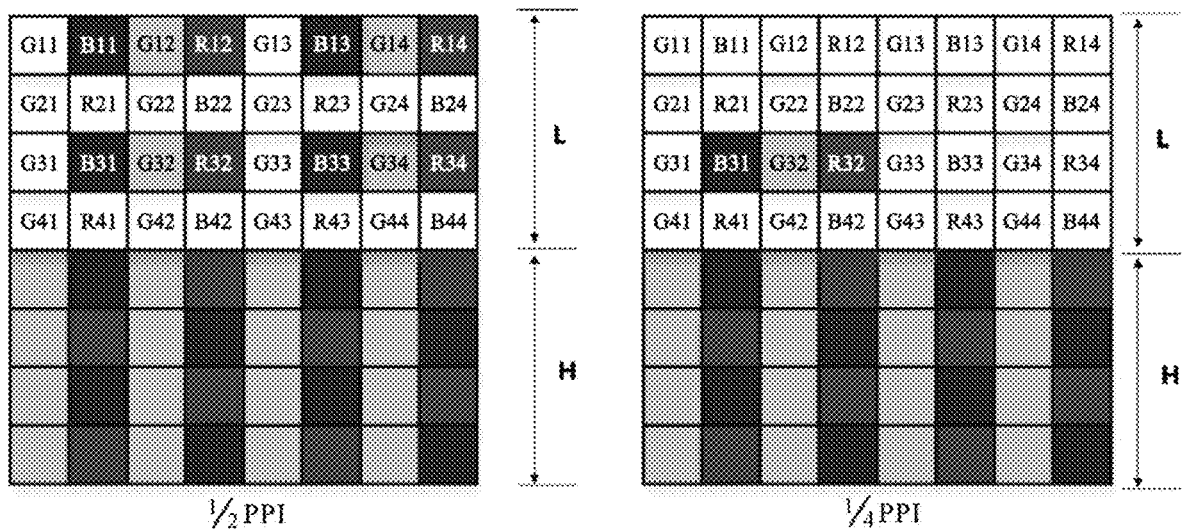
FIG. 1 is a schematic diagram of pixel distribution in the related art.

Referring to FIG. 1, a display area (AA) of the display panel in the related art can be divided into an upper area and a lower area, i.e., an upper area L which has a low Pixel Per Inch (PPI) and is partially transparent, and a lower area H which has a high PPI and is not transparent. Generally, the area L improves transmittance by reducing the number of pixels, and the area H is conventionally designed that one pixel consists of two sub-pixels and a GGRB algorithm is adopted. In the area L, the number of sub-pixels is reduced on the basis of arrangement of sub-pixels of the area H, for example, in the area L, only three sub-pixels remain in 2×2 pixels, and PPI is reduced to half of PPI in the area H, or, three sub-pixels remain in 4×4 pixels, and PPI is reduced to one quarter of PPI in the area H.

Figure 2:
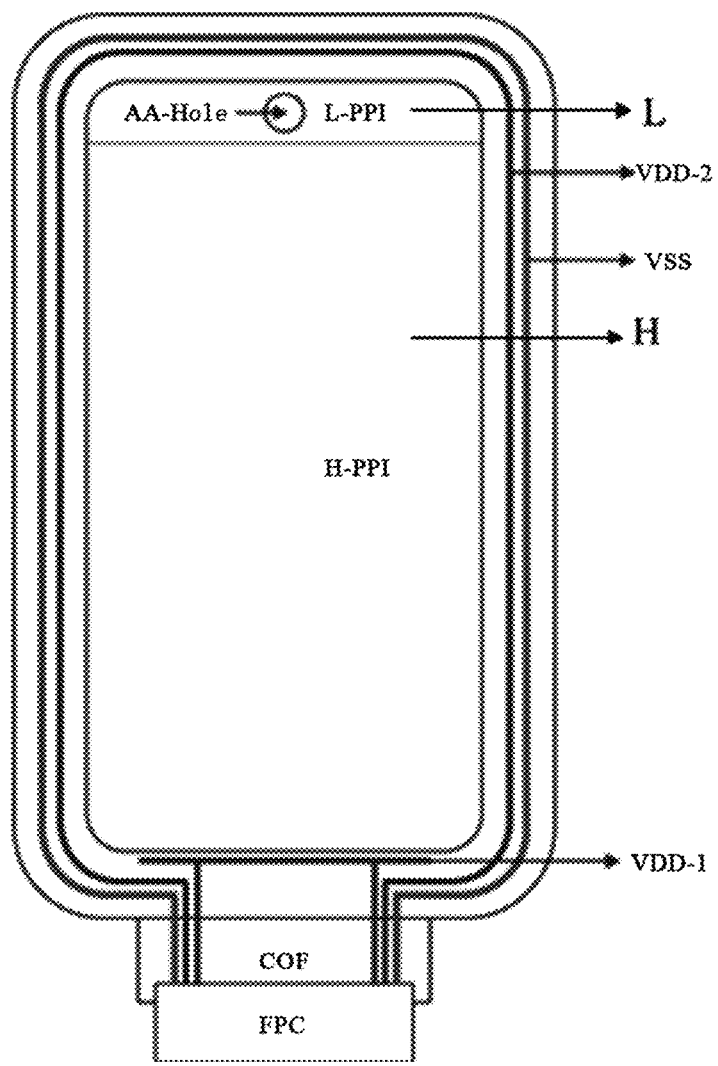
FIG. 2 is a structural schematic diagram of a display device provided by an embodiment of the present disclosure.
Figure 3:
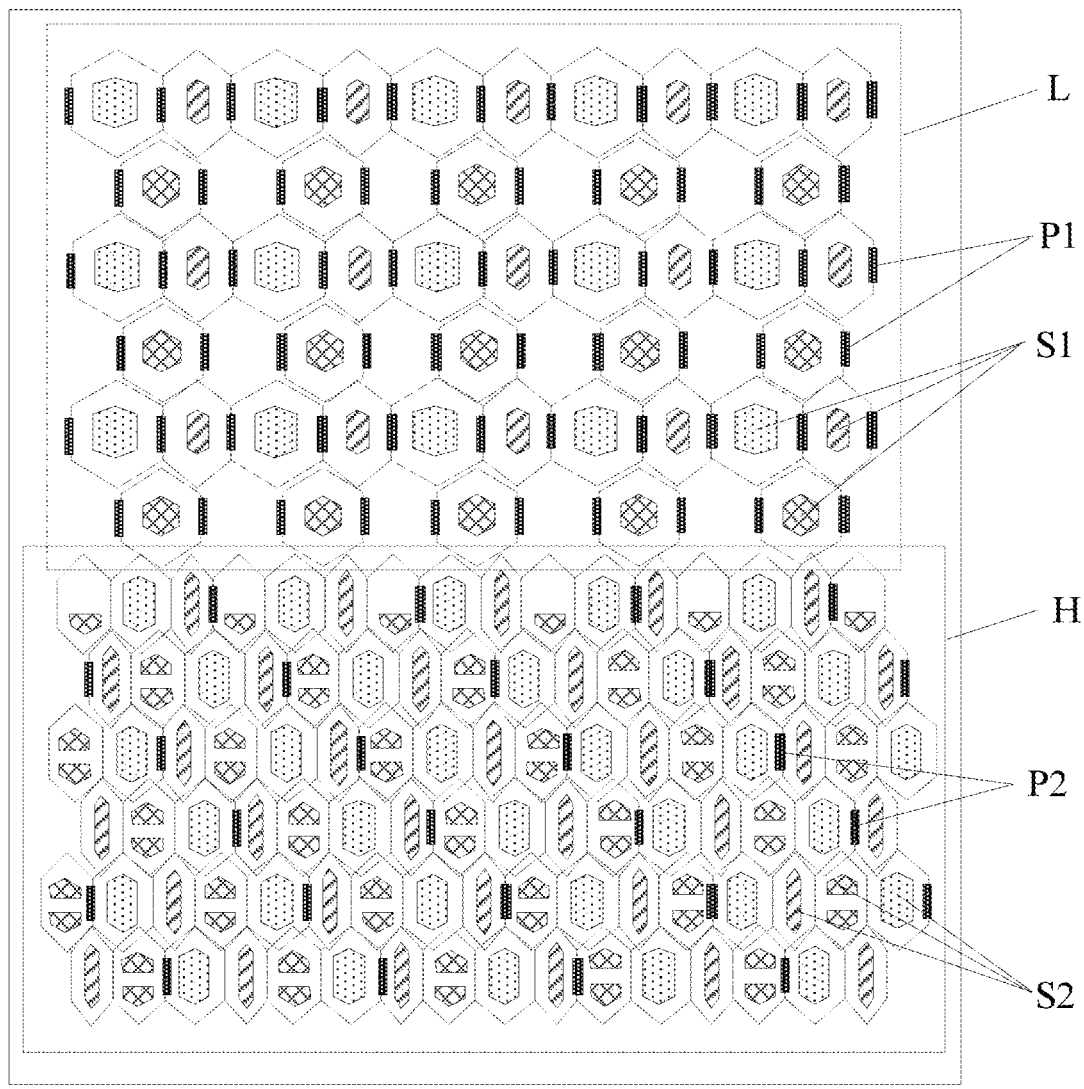
FIG. 3 is a schematic diagram of first distribution of first pixel apertures and second pixel apertures provided by an embodiment of the present disclosure.

In combination with FIG. 2 and FIG. 3, an embodiment of the present disclosure provides a display panel comprising a transparent display area L and a non-transparent display area H. The transparent display area L has a plurality of first pixel apertures S1 and the non-transparent display area H has a plurality of second pixel apertures S2, where a density of the first pixel apertures S1 in the transparent display area L is smaller than a density of the second pixel apertures S2 in the non-transparent display area H, and opposite sides of each of the first pixel apertures S1 are provided with first spacers P1.

In an embodiment of the present disclosure, the display panel comprises a transparent display area L having a plurality of first pixel apertures S1 and a non-transparent display area H having a plurality of second pixel apertures S2, where a density of the first pixel apertures S1 in the transparent display area L is smaller than a density of the second pixel apertures S2 in the non-transparent display area H. Opposite sides of each of the first pixel apertures S1 is provided with first spacers P1, in other words, two sides of each of the first pixel apertures S1 in the transparent display area L are provided with first spacers P1, and the two first spacers P1 correspond to the same one first pixel aperture S1 are symmetrical to each other on two sides of the same one first pixel aperture S1, so that on the one hand, the number of the first spacers P1 in the transparent display area L is increased so as to avoid a circumstance that when a density of apertures corresponding to a mask is adjusted along with the density of the first pixel apertures of the area L, the spacers (PS) in the area L may not provide enough support for the mask during the vapor plating process if the spacers (PS) in the transparent display area are still distributed in a PS mode of the area H to possibly further cause damage to a film layer of the display panel during a manufacturing process, and on other hand, non-uniformity of visual color errors in the transparent display area can be improved to avoid a circumstance that asymmetrical distribution of the spacers in the transparent display area will lead to different resistances to light so as to further cause non-uniformity of the visual color errors when the display panel is viewed from different angles.

It should be noted that in some implementations, referring to FIG. 2, a Face ID infrared sensor and the like may be at the lower part of the area L. However, due to existence of a polarizer (Pol) in the area AA, visible light transmittance in the area L is low and imaging needs of a front camera cannot be satisfied, so that it is necessary to provide a via hole (AA hole) in the center of the area L for arranging a visual light camera, where a physical hole design may be adopted, or, a blind hole may also be adopted (i.e. the via hole does not penetrate through the entire display panel in a depth direction), and a polyimide (PI) film layer, an inorganic film layer and the like of the display panel are retained. Besides, the display panel generally further includes a first power supply signal line VDD1, a second power supply signal line VDD2 and a third power supply signal line VSS to provide three power supply voltages. The area H is driven by the first power supply signal line VDD1 and the third power supply signal line VSS, and the area L is driven by the second power supply signal line VDD2 and the third power supply signal line VSS. The first power supply signal line VDD1 and the second power supply signal line VDD2 are two independent positive voltage power supplies and have different voltage values. The third power supply signal line VSS is a negative voltage power supply. For instance, a voltage provided by the first power supply signal line VDD1 may be 4.6V, a voltage provided by the second power supply signal line VDD2 may be 5.6 v, and a voltage provided by the third power supply signal line VSS may be −2.4V. Under the driving by the same Vdata in the area H and the area L, brightness of sub-pixels in the area L can be higher than brightness in the area H so as to achieve a purpose of improving entire brightness of the area L. A display device may further comprise a Flexible Printed Circuit (FPC) bound to the display panel via a Chip On Film COF.

Figure 4:
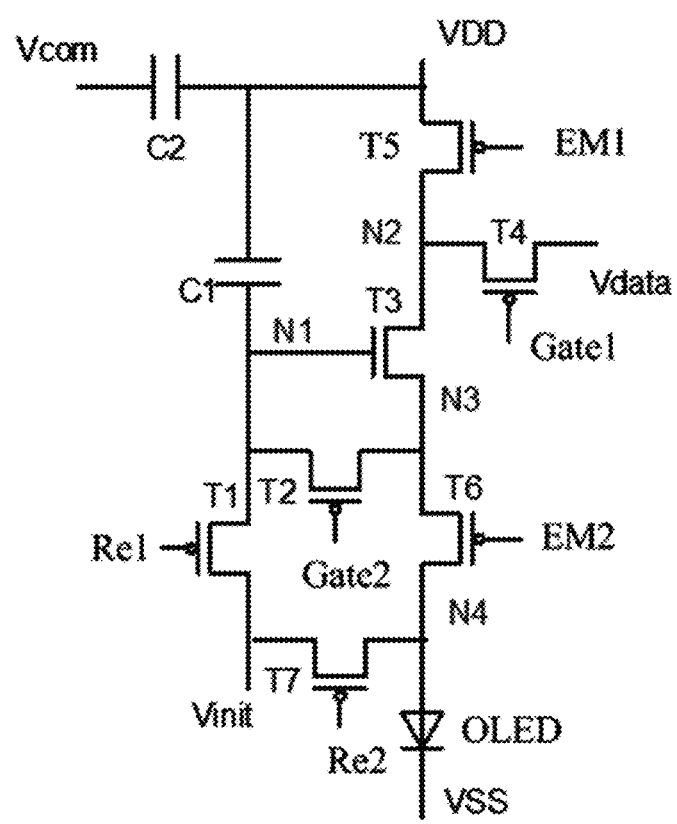
FIG. 4 is a structural schematic diagram of a pixel circuit provided by an embodiment of the present disclosure.

In some implementations, the area H and the area L may be driven by using the same pixel circuit, and have the same layout size, the same transistor (TFT) size and the same driving mode. Under the driving by the same data voltage (Data), brightness of second pixels of the area H is the same as brightness of the first pixels of the area L when the first power supply signal line VDD1 and the second power supply signal line VDD2 are the same. A pixel circuit corresponding to the first pixels and a pixel circuit corresponding to the second pixels are specifically as shown in FIG. 4, and the pixel circuit comprises a first transistor T1, a second transistor T2, a third transistor T3, a fourth transistor T4, a fifth transistor T5, a sixth transistor T6, a seventh transistor T7, a first capacitor C1, a second capacitor C2 and a light emitting diode OLED. A first terminal of the second capacitor C2 is electrically connected with a common voltage signal terminal Vcom, and a second terminal of the second capacitor C2 is electrically connected with a first terminal of the first capacitor C1, a first electrode of the fifth transistor T5 and a power supply signal terminal VDD (which may be the second power supply signal line VDD2 if the pixel circuit in FIG. 4 is the pixel circuit corresponds to the first pixels in the area L, or may be the first power supply signal line VDD1 if the pixel circuit in FIG. 4 is the pixel circuit corresponds to the second pixels in the area H). A second terminal of the first capacitor C1 is electrically connected with a first electrode of the first transistor T1, a first electrode of the second transistor T2 and a gate of the third transistor T3. A gate of the transistor T1 is electrically connected with a first reset signal terminal Re1 and a second electrode of the first transistor T1 is electrically connected with a starting signal terminal Vint and a first electrode of the seventh transistor T7. A gate of the fifth transistor T5 is electrically connected with a first light emitting control signal terminal EM1, and a second electrode of the fifth transistor T5 is electrically connected with a first electrode of the fourth transistor T4 and a first electrode of the third transistor T3, A second electrode of the third transistor T3 is electrically connected with a first electrode of the sixth transistor T6 and a second electrode of the second transistor T2. A gate of the sixth transistor T6 is electrically connected with a second light emitting control signal terminal EM2, and a second electrode of the sixth transistor T6 is electrically connected with a first electrode of the light emitting diode OLED and a second electrode of the seventh transistor T7. A gate of the fourth transistor T4 is electrically connected with a first gate line Gate1 and a second electrode of the fourth transistor T4 is electrically connected with a data line Vdata. A gate of the second transistor T2 is electrically connected with a second gate line Gate2. A gate of the seventh transistor T7 is electrically connected with a second reset signal terminal Re2. A second electrode of the light emitting diode OLED is electrically connected with a third power supply signal terminal VSS.

Figure 5:
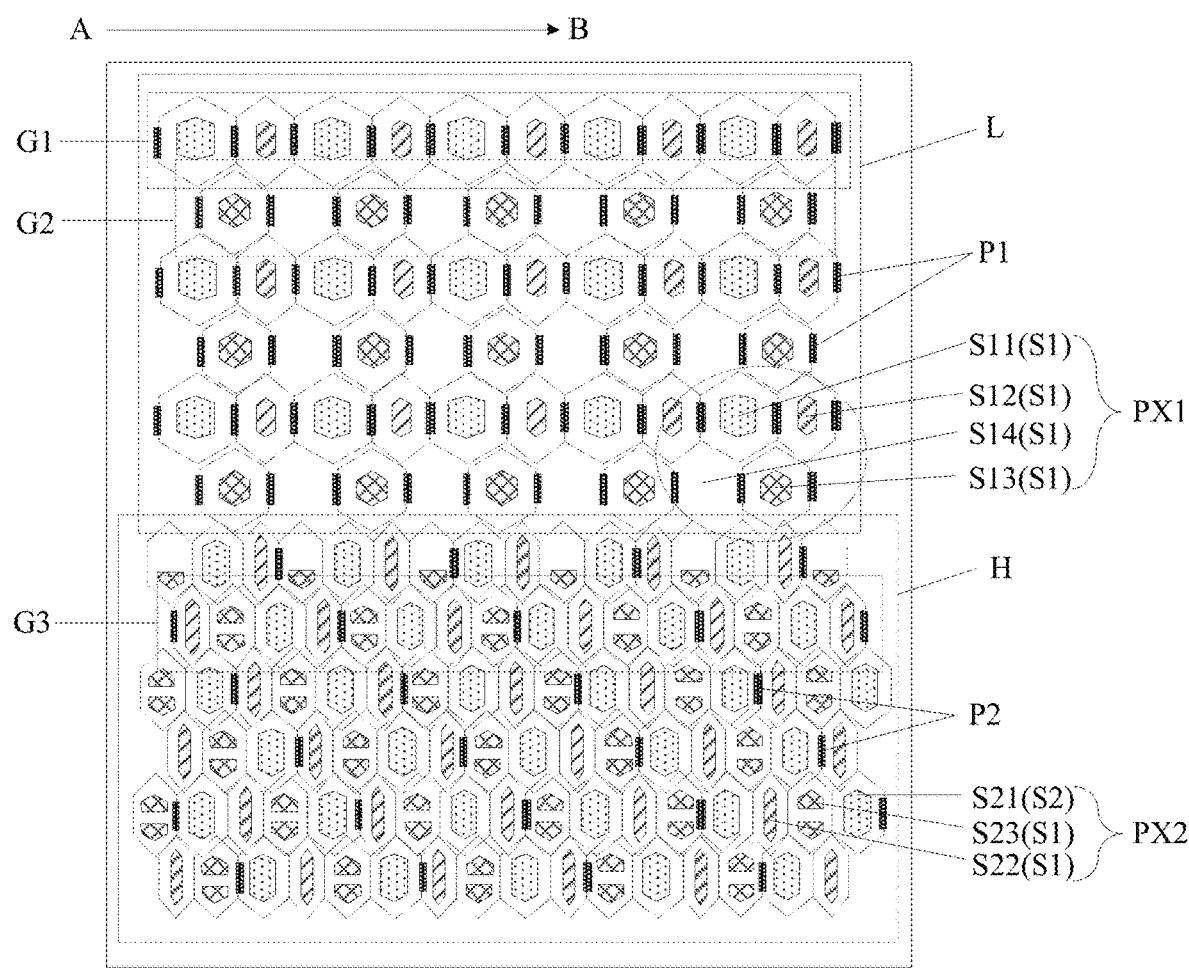
FIG. 5 is a schematic diagram of second distribution of first pixel apertures and second pixel apertures provided by an embodiment of the present disclosure.

In some implementations, referring to FIG. 5, the first pixel apertures S1 comprise first color pixel apertures S11, second color pixel apertures S12, third color pixel apertures S13 and first transparent areas S14, where the first color pixel apertures S11 and the second color pixel apertures are alternately arranged in sequence along a first direction AB to form first-type pixel rows G1, the third color pixel apertures S13 and the first transparent areas S14 are alternately arranged in sequence along a direction parallel to the first direction AB to form second-type pixel rows G2, and the first-type pixel rows G1 and the second-type pixel rows G2 are alternately arranged along a direction perpendicular to the first direction.

In the first-type pixel rows G1, first spacers P1 are positioned between the adjacent first color pixel apertures S11 and second color pixel apertures S12. In the second-type pixel rows G2, the first spacers P1 are positioned between the adjacent third color pixel apertures S13 and first transparent areas S14. It should be noted that FIG. 3 and FIG. 5 are merely used for schematic description according to part of the first pixel apertures S1 and the second pixel apertures S2 of the display panel, the display panel may further comprise more of the first pixel apertures S1 and the second pixel apertures S2 in specific implementation, and the present disclosure is not limited herein.

In an embodiment of the present disclosure, the first pixel apertures S1 may be divided into the first color pixel apertures S11, the second color pixel apertures S12, the third color pixel apertures S13 and the first transparent areas S14. The first color pixel apertures S11 and the second color pixel apertures S12 are alternately arranged in sequence along the first direction AB to form the first-type pixel rows G1, the third color pixel apertures S13 and the first transparent areas S14 are alternately arranged in sequence along the direction parallel to the first direction AB to form the second-type pixel rows G2. The first-type pixel rows G1 and the second-type pixel rows G2 are alternately arranged along the direction perpendicular to the first direction. In the first-type pixel rows G1, the first spacers P1 are positioned between the adjacent first color pixel apertures S11 and second color pixel apertures S12. In the second-type pixel rows G2, the first spacers P1 are positioned between the adjacent third color pixel apertures S13 and first transparent areas S14. Not only can a certain transparency of the area L of the display panel be ensured, but also requirements for providing the substantially same support for masks in the area L and the area H can be satisfied.

In some implementations, referring to FIG. 3 and FIG. 5, the first spacers P1 and second spacers P2 may be strip-shaped, and the strip-shaped first spacers P1 and the strip-shaped second spacers P2 extend along an extending direction perpendicular to the first direction AB. In the first-type pixel rows G1 and the second-type pixel rows G2, a plurality of first spacers P1 are arranged in sequence along the first direction AB.

In some implementations, referring to FIG. 3 and FIG. 5, the first spacers P1 of the first-type pixel rows G1 and the first spacers P1 of the second-type pixel rows G2 are in staggered arrangement. In an embodiment of the present disclosure, the first spacers P1 of the first-type pixel rows G1 and the first spacers P1 of the second-type pixel rows G2 are in staggered arrangement, so that the first spacers P1 can be distributed uniformly in the area L on the whole, and a better effect of improving color errors can be achieved.

Figure 6:
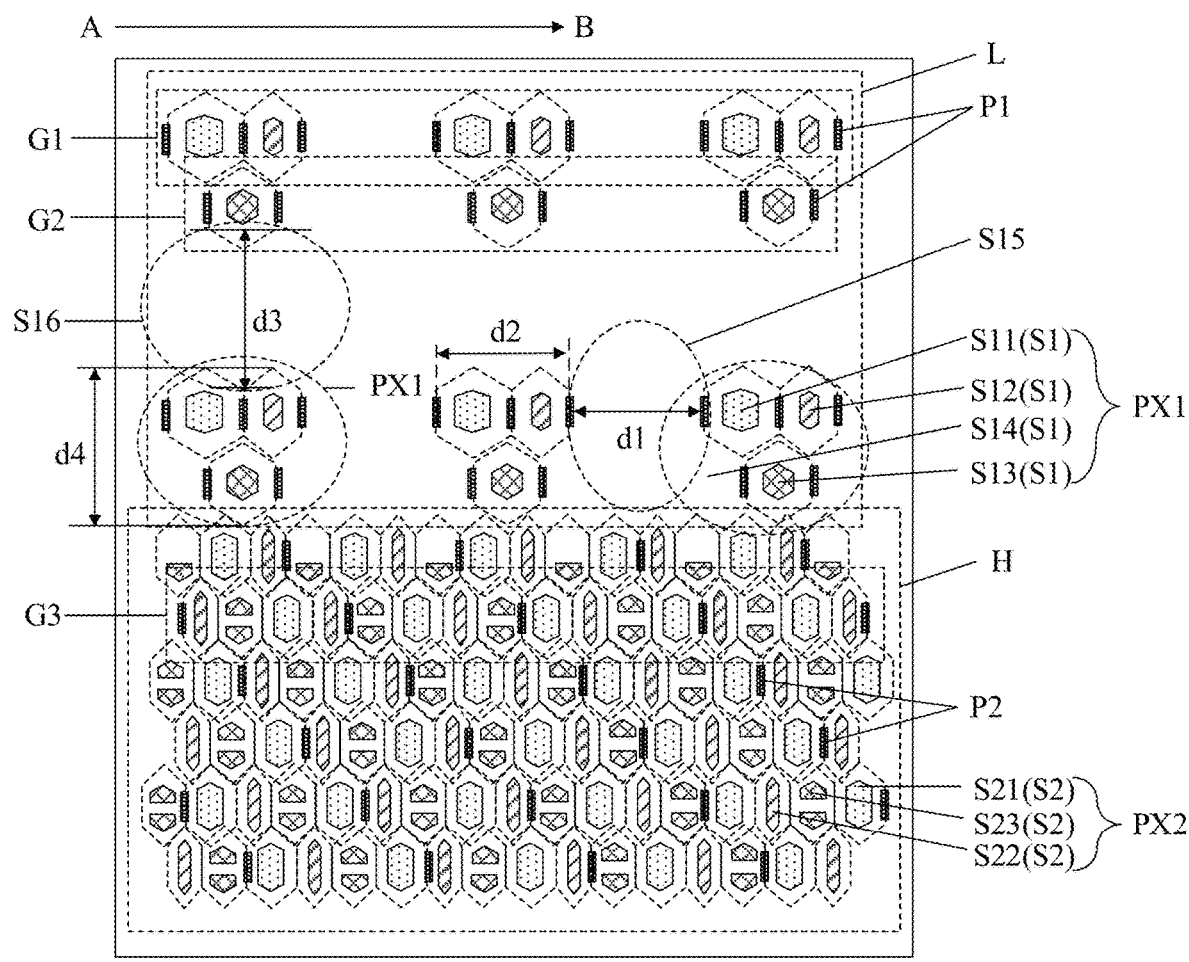
FIG. 6 is a schematic diagram of third distribution of first pixel apertures and second pixel apertures provided by an embodiment of the present disclosure.

In some implementations, the each group of adjacent first color pixel aperture S11, second color pixel aperture S12, third color pixel aperture S13 and first transparent area S14 forms one first pixel PX1, that is, referring to FIG. 5, the first color pixel aperture S11, the second color pixel aperture S12, the third color pixel aperture S13 and the first transparent area S14 circled by a dotted circle may form one first pixel PX1. The first pixels PX1 are arranged sequentially in a contact manner along a direction parallel to the first direction AB, in other words, the first pixels PX1 are closely arranged, as shown in FIG. 3 and FIG. 5. Or, second transparent areas S15 are formed by the every two adjacent first pixels PX1 along a direction parallel to the first direction AB, widths d1 of the second transparent areas S15 in the first direction AB are the same as widths d2 of the first pixels PX1 in the first direction AB, and third transparent areas S16 are formed by the every two adjacent first pixels PX1 along a direction perpendicular to the first direction AB, widths d3 of the third transparent areas S16 in a direction perpendicular to the first direction AB are the same as widths d4 of the first pixels PX1 in a direction perpendicular to the first direction AB, that is, as shown in FIG. 6, another first pixel PX1 row is arranged at an interval of a width of one first pixel PX1 row, and in each of the first pixel PX1 rows, another first pixel PX1 is arranged at an interval of a width of one first pixel PX1. It should be noted that when the density of the first pixel apertures of the area L is reduced to a lower level, the density of the apertures corresponding to the mask become smaller and the required support for the mask is less, and thus, the arrangement that another first pixel PX1 row is arranged at an interval of a width of one first pixel PX1 row, and in each of the first pixel PX1 rows, another first pixel PX1 is arranged at an interval of a width of one first pixel PX1, can satisfy the support for the mask in the area L.

In some implementations, shape of the first color pixel aperture S11, shape of the second color pixel aperture S12 and shape of the third color pixel aperture S13 are similar to each other. Specifically, the first color pixel apertures S11, the second color pixel apertures S12 and the third color pixel apertures S13 are hexagonal. In an embodiment of the present disclosure, the first color pixel apertures S11, the second color pixel apertures S12 and the third color pixel apertures S13 are hexagonal, the first color pixel apertures S11 and the second color pixel apertures S12 are positioned in the same row, and the third color pixel apertures S13 and the first transparent areas S14 are positioned in a row adjacent to the row in which the first color pixel apertures S11 and the second color pixel apertures S12 are positioned, so that emitted light of each of the first pixels is concentrated to be beneficial for effective display of the transparent area.

In some implementations, referring to FIG. 3, FIG. 5 and FIG. 6, a vertex connecting line where two opposite corners of each first color pixel aperture S11 lie is perpendicular to the first direction AB, a vertex connecting line where two opposite corners of each second color pixel aperture S12 lie is perpendicular to the first direction AB, and a vertex connecting line where two opposite corners of each third color pixel aperture S13 lie is perpendicular to the first direction. Optionally, length of the first color pixel aperture S11 in a direction parallel to the first direction AB is greater than or equal to width of the first color pixel aperture S11 in a direction perpendicular to the first direction AB, length of the second color pixel aperture S12 in a direction parallel to the first direction AB is greater than or equal to width of the second color pixel aperture S12 in a direction perpendicular to the first direction AB, and length of the third color pixel aperture S13 in a direction parallel to the first direction AB is greater than or equal to width of the third color pixel aperture S13 in a direction perpendicular to the first direction AB. In an embodiment of the present disclosure, the first color pixel apertures S11, the second color pixel apertures S12 and the third color pixel aperture S13 are hexagonal. In addition, a vertex connecting line where two opposite corners of each first color pixel aperture S11 lie is perpendicular to the first direction AB, a vertex connecting line where two opposite corners of each second color pixel aperture S12 lie is perpendicular to the first direction AB, and a vertex connecting line where two opposite corners of each third color pixel aperture S13 lie is perpendicular to the first direction AB, that is, the hexagonal first color pixel apertures S11, the hexagonal second color pixel apertures S12 and the hexagonal third color pixel apertures S13 are arranged upright along the first direction, thus being beneficial for concentration of emitted light of the first pixels.

In some implementations, the first color pixel apertures S11 may be blue pixel apertures, the second color pixel apertures S12 may be red pixel apertures and the third color pixel apertures S13 may be green pixel apertures. In other words, in an embodiment of the present disclosure, the blue pixel apertures and the red pixel apertures are positioned in the same row, and the green pixel apertures and the first transparent areas S14 are positioned in the same row.

In some implementations, areas of the blue pixel apertures are larger than areas of the green pixel apertures, and the areas of the green pixel apertures are larger than areas of the red pixel apertures. In an embodiment of the present disclosure, a blue light emitting material has a short service life, a red light emitting material has a long service life, and therefore, the areas of the blue pixel apertures are larger than the areas of the green pixel apertures and the areas of the green pixel apertures are larger than the areas of the red pixel apertures, so that light emitting materials with different colors in the display panel can have substantially the same service life to avoid affecting a normal display effect after a long-term use when only one or two monochromatic light emitting materials emit light.

In some implementations, referring to FIG. 3, FIG. 5 and FIG. 6, the second pixel apertures S2 comprise fourth color pixel apertures S21, fifth color pixel apertures S22 and sixth color pixel apertures S23, where the fourth color pixel apertures S21, the fifth color pixel apertures S22 and the sixth color pixel apertures S23 are alternately arranged in sequence to form third-type pixel rows G3 which are arranged in sequence along a direction perpendicular to the first direction AB. Specifically, the fourth color pixel apertures S21 may be blue pixel apertures, the fifth color pixel apertures S22 may be green pixel apertures, and the sixth color pixel apertures S23 may be red pixel apertures.

In some implementations, in each of the third-type pixel rows G3, one second spacer P2 is arranged at an interval of plural ones of the color pixel apertures. For example, one second spacer P2 is arranged at an interval of four color pixel apertures in a third-type pixel row G3, as shown in FIG. 3, FIG. 5 and FIG. 6. The second spacer P2 may be positioned between the adjacent blue pixel aperture and red pixel aperture, between the adjacent red pixel aperture and green pixel aperture, or between the adjacent green pixel aperture and blue pixel aperture, so that symmetrical distribution of the second spacers P2 within a certain range can be ensured so as not to cause visual color errors in the area H. One second spacer P2 is arranged at an interval of plural ones of the color pixel apertures, the number of the second spacers in the area H can be substantially the same as the number of the spacers in the area L to avoid a condition that a too large disparity exists in the number of the spacers in the area H and the area L to result in imbalance of the support for the mask.

In some implementations, referring to FIG. 3, FIG. 5 and FIG. 6, in each two adjacent third-type pixel rows G3, the second spacers P2 in one of the two adjacent third-type pixel rows G3, and the second spacers P2 in other one of the two adjacent third-type pixel rows, are in staggered arrangement in sequence. In an embodiment of the present disclosure, the second spacers P2 in each two adjacent third-type pixel rows G3 are in staggered arrangement in sequence, so that the second spacers P2 can be uniformly distributed in the area H to avoid color errors in the area H.

In some implementations, in each two adjacent third-type pixel rows G3, the second pixel apertures S2 in one of the two adjacent third-type pixel rows, and the second pixel apertures S2 in other one of the two adjacent third-type pixel rows, are in staggered arrangement.

In some implementations, referring to FIG. 3, FIG. 5 and FIG. 6, gap areas are formed between the first spacers P1 and the first color pixel apertures S11, the first spacers P1 and the second color pixel apertures S12, the first spacers P1 and the third color pixel apertures S13, and, the first spacers P1 and the first transparent areas S14, in other words, the first spacers P1 and the first color pixel apertures S11 are not directly adjacent to each other, the first spacers P1 and the second color pixel apertures S12 are not directly adjacent to each other, the first spacers P1 and the third color pixel apertures S13 are not directly adjacent to each other, and, the first spacers P1 and the first transparent areas S14 are not directly adjacent to each other, so that can not only difficulty in manufacturing of the first spacers be reduced, but also the influence on manufacturing of light emitting materials of the first pixel apertures when the first spacers P1 and the first color pixel apertures S11, the first spacers P1 and the second color pixel apertures S12, the first spacers P1 and the third color pixel apertures S13, and, the first spacers P1 and the first transparent areas S14 are closely adjacent can be avoided.

In some implementations, the display panel further comprises a pixel defining layer PDL, the first pixel apertures S1 and the second pixel apertures S2 are apertures of the pixel defining layer PDL. Optionally, the first pixel apertures S1 and the second pixel apertures S2 may be used for forming the light emitting materials.

An embodiment of the present disclosure also provides a display device comprising the display panel provided by the embodiment of the present disclosure.

The embodiments of the present disclosure achieve the following beneficial effects: the display panel comprises the transparent display area L having a plurality of first pixel apertures S1 and the non-transparent display area H having a plurality of second pixel apertures S2, where the density of the first pixel apertures S1 of the transparent display area L is smaller than the density of the second pixel apertures S2 of the non-transparent display area H; the opposite sides of each of the first pixel apertures S1 are provided with first spacers, in other words, the first pixel apertures of the transparent display area are provided with the first spacers P1, and the two spacers correspond to the same one first pixel aperture are symmetrical to each other on the two sides of the same one first pixel aperture, so that the number of the first spacers in the transparent display area is increased so as to avoid the circumstance that when the density of the apertures corresponding to the mask is adjusted along with the density of the first pixel apertures of the area L, the spacers (PS) in the area L may not provide enough support for the mask during the vapor plating process if the spacers (PS) in the transparent display area are still distributed in the PS mode of the area H to possibly further cause damage to the film layer of the display panel during the manufacturing process, and the non-uniformity of the visual color errors in the transparent display area can be improved to avoid the circumstance that the asymmetrical distribution of the spacers in the transparent display area will lead to different resistances to light to further cause the non-uniformity of the visual color errors when the display panel is viewed from different angles.

It is apparent that those skilled in the art can make various alternations and modifications to the present disclosure without departing from the spirit and scope of the present disclosure. Therefore, if the alternations and modifications to the present disclosure belong to the scope of the claims of the present disclosure and equivalents thereof, the present disclosure is intended to contain the alternations and modifications.

What is claimed is:

1. A display panel, comprising:
a transparent display area, and
a non-transparent display area;
wherein
the transparent display area has a plurality of first pixel apertures;
the non-transparent display area has a plurality of second pixel apertures; and
a density of the plurality of first pixel apertures of the transparent display area is smaller than a density of the plurality of second pixel apertures of the non-transparent display area; and
wherein opposite sides of each of the plurality of first pixel apertures are provided with first spacers.

2. The display panel according to claim 1, wherein each of the plurality of first pixel apertures comprises a first color pixel aperture, a second color pixel aperture, a third color pixel aperture and a first transparent area;
wherein the first color pixel apertures and the second color pixel apertures are alternately arranged in sequence along a first direction to form first-type pixel rows;
wherein the third color pixel apertures and the first transparent areas are alternately arranged in sequence along a direction parallel to the first direction to form second-type pixel rows; and
wherein the first-type pixel rows and the second-type pixel rows are alternately arranged along a direction perpendicular to the first direction; and wherein
in each of the first-type pixel rows, each of the first spacers is positioned between adjacent the first color pixel aperture and the second color pixel aperture, and
in each of the second-type pixel rows, each of the first spacers is positioned between adjacent the third color pixel aperture and the first transparent area.

3. The display panel according to claim 2, wherein the first spacers in each of the first-type pixel rows and the first spacers in each of the second-type pixel rows are in staggered arrangement.

4. The display panel according to claim 2, wherein
each group of adjacent first color pixel aperture, second color pixel aperture, third color pixel aperture, and first transparent area, among the first color pixel apertures, the second color pixel apertures, the third color pixel apertures, and the first transparent areas, constitutes a first pixel;
second transparent areas are formed between every two adjacent first pixels along a direction parallel to the first direction, a width of each of the second transparent areas in the first direction and a width of each of the first pixels in the first direction are a same width; and
third transparent areas are formed between every two adjacent first pixels along a direction perpendicular to the first direction, a width of each of the third transparent areas in the direction perpendicular to the first direction and the width of each of the first pixels in the direction perpendicular to the first direction is a same width.

5. The display panel according to claim 2, wherein a shape of each of the first color pixel apertures, a shape of each of the second color pixel apertures and a shape of each of the third color pixel apertures are similar.

6. The display panel according to claim 5, wherein each of the first color pixel apertures, each of the second color pixel apertures and each of the third color pixel apertures are hexagonal.

7. The display panel according to claim 6, wherein
a line connecting vertexes of two opposite corners of each of the first color pixel apertures is perpendicular to the first direction,
a line connecting vertexes of two opposite corners of each of the second color pixel apertures is perpendicular to the first direction, and
a line connecting vertexes of two opposite corners of each of the third color pixel apertures is perpendicular to the first direction.

8. The display panel according to claim 2, wherein
the first color pixel apertures are blue pixel apertures,
the second color pixel apertures are red pixel apertures, and
the third color pixel apertures are green pixel apertures.

9. The display panel according to claim 8, wherein
an area of each of the blue pixel apertures is larger than an area of each of the green pixel apertures, and
an area of each of the green pixel apertures is larger than an area of each of the red pixel apertures.

10. The display panel according to claim 3, wherein
each of the second pixel apertures comprises a fourth color pixel aperture, a fifth color pixel aperture and a sixth color pixel aperture, and
wherein the fourth color pixel apertures, the fifth color pixel apertures and the sixth color pixel apertures are alternately arranged in sequence along a direction parallel to the first direction to form third-type pixel rows.

11. The display panel according to claim 10, wherein a second spacer is arranged at an interval of plural ones, of the fourth color pixel apertures, the fifth color pixel apertures and the sixth color pixel apertures, in each of the third-type pixel rows.

12. The display panel according to claim 11, wherein in each of two adjacent third-type pixel rows, the second spacers in one of the two adjacent third-type pixel rows, and the second spacers in other one of the two adjacent third-type pixel rows, are in staggered arrangement in sequence.

13. The display panel according to claim 1, wherein gap areas are formed between the first spacers and the first color pixel apertures, the first spacers and the second color pixel apertures, the first spacers and the third color pixel apertures, and, the first spacers and the first transparent area.

14. The display panel according to claim 1, further comprising a pixel defining layer, where the first pixel apertures and the second pixel apertures are apertures of the pixel defining layer.

15. A display device, comprising the display panel according to claim 1, wherein the display panel comprises:
a transparent display area, and
a non-transparent display area;
wherein
the transparent display area has a plurality of first pixel apertures;
the non-transparent display area has a plurality of second pixel apertures; and
a density of the plurality of first pixel apertures of the transparent display area is smaller than a density of the plurality of second pixel apertures of the non-transparent display area; and
wherein opposite sides of each of the plurality of first pixel apertures are provided with first spacers.

16. The display device according to claim 15, wherein each of the plurality of first pixel apertures comprises a first color pixel aperture, a second color pixel aperture, a third color pixel aperture and a first transparent area;
wherein the first color pixel apertures and the second color pixel apertures are alternately arranged in sequence along a first direction to form first-type pixel rows;
wherein the third color pixel apertures and the first transparent areas are alternately arranged in sequence along a direction parallel to the first direction to form second-type pixel rows; and
wherein the first-type pixel rows and the second-type pixel rows are alternately arranged along a direction perpendicular to the first direction; and wherein
in each of the first-type pixel rows, each of the first spacers is positioned between adjacent the first color pixel aperture and the second color pixel aperture, and
in each of the second-type pixel rows, each of the first spacers is positioned between adjacent the third color pixel aperture and the first transparent area.

17. The display device according to claim 16, wherein the first spacers in each of the first-type pixel rows and the first spacers in each of the second-type pixel rows are in staggered arrangement.

18. The display device according to claim 16, wherein
each group of adjacent first color pixel aperture, second color pixel aperture, third color pixel aperture, and first transparent area, among the first color pixel apertures, the second color pixel apertures, the third color pixel apertures, and the first transparent areas, constitutes a first pixel;
second transparent areas are formed between every two adjacent first pixels along a direction parallel to the first direction, a width of each of the second transparent areas in the first direction and a width of each of the first pixels in the first direction are a same width; and
third transparent areas are formed between every two adjacent first pixels along a direction perpendicular to the first direction, a width of each of the third transparent areas in the direction perpendicular to the first direction and the width of each of the first pixels in the direction perpendicular to the first direction is a same width.

19. The display device according to claim 16, wherein a shape of each of the first color pixel apertures, a shape of each of the second color pixel apertures and a shape of each of the third color pixel apertures are similar.

20. The display device according to claim 19, wherein each of the first color pixel apertures, each of the second color pixel apertures and each of the third color pixel apertures are hexagonal.

* * * * *